(12) United States Patent
Jung et al.

(10) Patent No.: US 6,692,891 B2
(45) Date of Patent: Feb. 17, 2004

(54) PHOTORESIST COMPOSITION CONTAINING PHOTO RADICAL GENERATOR WITH PHOTOACID GENERATOR

(75) Inventors: Jae Chang Jung, Kyoungki-do (KR); Geun Su Lee, Kyoungki-do (KR); Min Ho Jung, Kyoungki-do (KR); Ki Ho Baik, Kyoungki-do (KR)

(73) Assignee: Hynix Semiconductor Inc, Kyoungki (KR)

( * ) Notice: Subject to any disclaimer, the term of this patent is extended or adjusted under 35 U.S.C. 154(b) by 72 days.

(21) Appl. No.: 09/879,325

(22) Filed: Jun. 12, 2001

(65) Prior Publication Data

US 2002/0012873 A1 Jan. 31, 2002

(30) Foreign Application Priority Data

Jun. 30, 2000 (KR) ........................................ 2000-37228

(51) Int. Cl.$^7$ ..................... G03F 7/038; G03F 7/039; G03F 7/32; G03F 7/38; G03F 7/40
(52) U.S. Cl. ..................... 430/270.1; 430/325; 430/326; 430/311; 430/327; 430/914; 430/916; 430/921; 430/923; 430/925
(58) Field of Search ............................. 430/270.1, 325, 430/326, 311, 327, 328, 914, 916, 921, 923, 925

(56) References Cited

U.S. PATENT DOCUMENTS

| | | | | |
|---|---|---|---|---|
| 4,245,029 A | * | 1/1981 | Crivello | 430/280.1 |
| 4,968,582 A | * | 11/1990 | Tranjan et al. | 430/270.1 |
| 5,393,642 A | * | 2/1995 | DuBois et al. | 430/271.1 |
| 6,004,721 A | * | 12/1999 | Tan et al. | 430/270.1 |
| 6,051,368 A | | 4/2000 | Masuko et al. | 430/288.1 |

FOREIGN PATENT DOCUMENTS

| | | | | |
|---|---|---|---|---|
| GB | 2320718 A | * | 7/1998 | G03F/7/038 |
| GB | 2347429 A | * | 9/2000 | G03F/7/039 |
| GB | 2 354 596 A | | 3/2001 | |
| JP | 4-349463 | * | 12/1992 | |
| JP | 11-305433 | | 5/1999 | |
| JP | 11-95435 | | 9/1999 | |
| WO | WO-97/33198 A1 | * | 9/1997 | G03F/7/039 |

OTHER PUBLICATIONS

Chemical Abstract 118: 244602—English abstract for JP 4–349463, Dec. 3, 1992.*
STN database search for other names for "Darocur 1173".*
Full English Translation of JP 4–349453 (Ban et al) which was published in Dec. 3, 1992.*
Photonic Dictionary :Definition for word(s) vacuum ultraviolet (VUV) radiation at a laurin Web site, The Photonics Directory, copyright 1996–293, one page.*
J.V. Crivello et al, "Triarylsulfonium Salts Ans Photoinitiators of Free Radical and Cationic Polymerization", Journal of Polymer Science: Polymer Letters Edition, vol. 17, pp. 759–764, year only—1979.*
RN 210040–28–1, Registry, ACS, copyright 2003 from the STN database online, 2 pages.*
Masamitsu Shirai etr al., "Photoacid and Photobase Generators: Chemistry and Applications to Polymeric Materials," pp. 1–45, Prog. Polym. Sci., vol. 21 (1996).
United Kingdom Search Report dated Oct. 8, 2001.

* cited by examiner

*Primary Examiner*—Cynthia Hamilton
(74) *Attorney, Agent, or Firm*—Marshall, Gerstein & Borun LLP (57) ABSTRACT

The present invention relates to a photoresist composition containing a photo radical generator, more specifically, to a photoresist composition which comprises (a) photoresist resin, (b) a photoacid generator, (c) an organic solvent and (d) a photo radical generator. The present photoresist composition reduces or prevents a sloping pattern formation due to a higher concentration of acid in the upper portion of the photoresist relative to the lower portion of the photoresist.

13 Claims, 5 Drawing Sheets

PHOTORESIST COMPOSITION CONTAINING PHOTO RADICAL GENERATOR WITH PHOTOACID GENERATOR

BACKGROUND OF THE INVENTION

1. Technical Field

A photoresist composition containing a photo radical generator (abbreviated as "PRG") is disclosed. In particular, a photoresist composition is disclosed which comprises (a) a photoresist resin, (b) a photoacid generator, (c) an organic solvent and (d) a photo radical generator. The photo radical generator reduces or prevents sloping pattern and I/D Bias due to a higher concentration of acid in the upper portion of the photoresist relative to the concentration of acid in the lower portion of the photoresist.

2. Description of the Related Art

Use of chemical amplification-type photoresists (i.e., photoresist compositions) is currently being investigated in photolithography processes using light source such as KrF, ArF, VUV and EUV to achieve a high sensitivity in a minute image-formation on semiconductor devices. Such photoresist compositions are generally prepared by blending a photoacid generator with a matrix resin polymer (i.e., photoresist polymer or photoresist resin) having an acid labile group.

In a photolithography process, the resolution of an image depends on the wavelength of the light used. Thus, the shorter the wavelength, the higher the resolution, i.e., shorter wavelengths allow smaller pattern formation.

In order to be useful in a photolithography process, a photoresist composition must have an excellent etching resistance, heat resistance, and adhesiveness. Moreover, to reduce the cost of manufacturing semiconductor devices, a photoresist composition should be capable of being developed with a common developing solution, such as commonly available 2.38 wt % aqueous tetramethylammonium hydroxide (TMAH) solution. These qualities are particularly important in photolithography processes utilizing a deep ultraviolet light source (i.e., short wavelength light source), including KrF (248 nm), ArF (193 nm), VUV (157 nm) and EUV (13 nm).

However, it is very difficult to synthesize a photoresist composition that satisfies all of these requirements. For example, a photoresist polymer having a polyacrylate backbone is readily available, but it has poor etching resistance and is difficult to develop.

Etching resistance may be improved by adding alicyclic unit to the photoresist polymer. However, the presence of alicyclic unit in the photoresist polymer creates problems during the process for manufacturing semiconductor elements. For example, a detrimental sloping pattern is formed when photoresist resin comprising the alicyclic units is used.

Figure 1A:
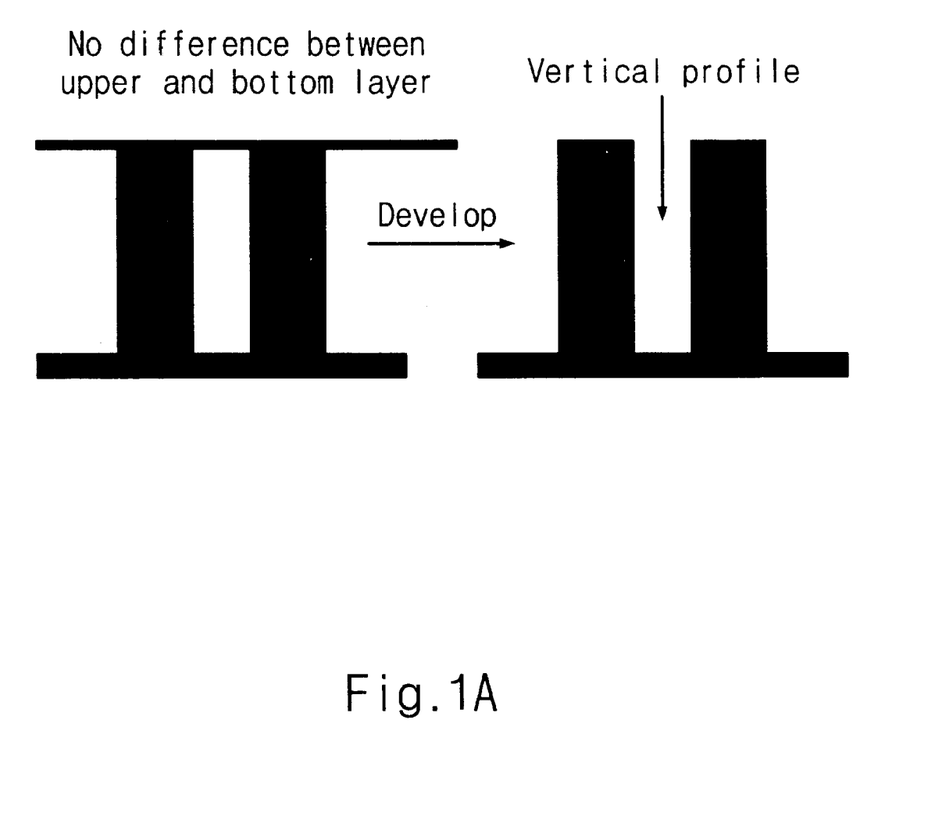
FIG. 1a is a cross sectional view of the vertical pattern formation when a coated photoresist composition has low light absorbance.

When the resin has low light absorbance, a vertical pattern is generated as shown in FIG. 1a. When a chemically amplified photoresist composition comprising the alicyclic units is used, the sloping pattern is formed since more light exposure is performed on the upper portions of the photoresist (PR) composition relative to the lower portion of the PR composition (See FIG. 1b). It is believed that the higher light exposure on the upper portions is due to an aerial image of the PR composition (or absorption of light by the resin).

Therefore, there is a need for a photoresist composition which overcomes the above-mentioned disadvantages.

SUMMARY OF THE DISCLOSURE

Photoresist compositions are disclosed which significantly reduce or prevent formation of a sloping pattern due to a higher concentration of generated acid in the upper portions of the photoresist compositions relative to the lower portions of the photoresist compositions.

A semiconductor element produced by using the disclosed photoresist composition is also disclosed.

DETAILED DESCRIPTION OF THE PRESENTLY PREFERRED EMBODIMENTS

A provides a photoresist composition comprising (a) a photoresist resin, (b) a photoacid generator, (c) a photo radical generator and (d) an organic solvent.

The photo radical generator for the present invention is preferably a compound of following Formula 1:

Formula 1 wherein, $R_1$ is hydrogen or $(C_1-C_5)$ alkyl; $R_2$ is hydrogen, $(C_1-C_5)$ alkyl or phenyl; and $R_3$ is hydrogen, $(C_1-C_5)$ alkyl, phenyl or $(C_1-C_5)$ alkoxy.

More preferably, the compound of Formula 1 is α,α-dimethoxy-α-phenylacetophenone of following Formula 1a or α-hydroxy-α,α-dimethylacetophenone of following Formula 1b:

Formula 1a

Formula 1b

Any of known photoacid generator, which is able to generate acids by light, can be used in PR composition of the present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

The mechanism of the photoresist composition comprising the photo radical generator will now be described in detail with reference to following Reaction Scheme 1 and Reaction Schemes 2a to 2c.

In the following Reaction Schemes, compound (IV), namely triphenylsulfonium triflate is used as a photoacid generator.

Reaction Scheme 1

Reaction Scheme 2a

Reaction Scheme 2b

-continued

Reaction Scheme 2c

When the photoacid generator (IV) contained in the photoresist composition is exposed to light, acid (X) is generated (see Reaction Schemes 2a to 2c). When the photoresist resin has high light absorbance, sloping pattern is formed since smaller amount of acid is generated in the lower portion of the PR composition than the upper portion of the PR composition as a result of a more light exposure on the upper portions of the PR composition relative to the lower portion of the PR composition (see FIG. 1b).

Although less light is received in the lower portion of the photoresist than the upper portion of the photoresist, a vertical pattern can be formed when the concentration of acid is similar in the upper and lower portions of the photoresist (see FIG. 1a). This effect can be obtained by the photo radical generator.

Important step of generating acid is Reaction Scheme 2b which shows transformation reaction from compound (VI) to compound (VIII). Therefore, generation of acid can be restricted by preventing such transformation reaction.

Referring to Reaction Scheme 1, when the photo radical generator (I) is exposed to light, radicals such as (II) and (III) are produced. The radicals of (II) and (III) react with the radical of (VI), thus interrupting the transformation from compound (VI) to compound (VIII). Accordingly, acid generation is restricted.

In more detail, more light is received in the upper portion of the photoresist than the lower portion of the photoresist, and thus many radicals (VI) are generated from the photoacid generators (IV) in the upper portion of the photoresist. The more compounds (VI) are generated, the more acids (X) are generated. However, the radicals of (II) and (III) generated from the photo radical generator (I) are also formed much more in the upper portion of the photoresist. And, the radicals of (II) and (III) react with compound (VI), thereby reducing production of compound (VIII). As a result, there are similar amounts of compound (VIII) which generates acids in the upper and lower portions of the photoresist. Therefore the concentration of acid is also similar in the upper and lower portions of the photoresist, thus obtaining the vertical pattern shown in FIG. 1a. Although the photoresist has high light absorbance, the photoresist can form a vertical pattern by using the photo radical generator.

On the other hand, the amount of photoacid generator used is in the range from 0.05% by weight to 10% by weight of the photoresist resin present in the composition.

The amount of photo radical generator is preferably in the range from 10 mole % to about 300 mole % of the photoacid generator.

The photoresist resin of the photoresist composition can be any currently known chemically amplified photoresist polymer disclosed in U.S. Pat. No. 5,212,043 (May 18, 1993), WO 97/33198 (Sep. 12,1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). It is preferable that the photoresist polymer be prepared by radical additional polymerization of cycloolefin comonomers and the ring structures of the cycloolefin comonomers remains in the main chain of the photoresist polymer. An exemplary photoresist polymer include poly(tert-butyl bicyclo[2.2.1]hept-5-ene-2-carboxylate/2-hydroxyethyl bicyclo[2.2.1]hept-5-ene-2-carboxylate/norbornylene/maleic anhydride) or poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride). In addition, PR polymers preferably comprise 2-hydroxethyl bicyclo[2.2.1]hept-5-ene-2-carboxylate or 2-hydroxethyl bicyclo[2.2.2]oct-5-ene-2-carboxylate in order to improve adhesiveness to wafer. The example of poly(tert-butyl bicyclo[2.2.1]hept-5-ene-2-carboxylate/2-hydroxyethyl bicyclo[2.2.1]hept-5-ene-2-carboxylate/norbornylene/maleic anhydride) is represented by following Formula 2:

Formula 2

While a variety of organic solvents disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000) are suitable for use in the photoresist composition of the present invention, the organic solvent is preferably selected from the group consisting of methyl 3-methoxypropionate, ethyl 3-ethoxypropionate, propylene glycol methyl ether acetate (PGMEA), cyclohexanone and 2-heptanone. The amount of organic solvent used in the photoresist composition is preferably from 200% by weight to 800% by weight of the photoresist resin.

Another embodiment of the present invention provides a process for forming a photoresist pattern comprising the steps of:

(a) coating a photoresist composition described above on a substrate to form a photoresist film;

(b) exposing the photoresist film to light; and (c) developing the exposed photoresist film.

The process for forming the photoresist pattern can further include a baking step before and/or after the exposure of step (b). The baking step is typically performed at temperature ranging from about 70° C. to about 200° C.

Preferably, the exposure step is performed by using a short wavelength light source such as ArF (193 nm), KrF (248 nm), VUV (157 nm), EUV (13 nm), E-beam, X-ray or ion beam. The exposure energy preferably ranges from about 1 mJ/cm$^2$ to about 100 mJ/cm$^2$.

Yet another embodiment of the present invention provides a semiconductor element manufactured using the photoresist compositions described above.

Figure 1B:
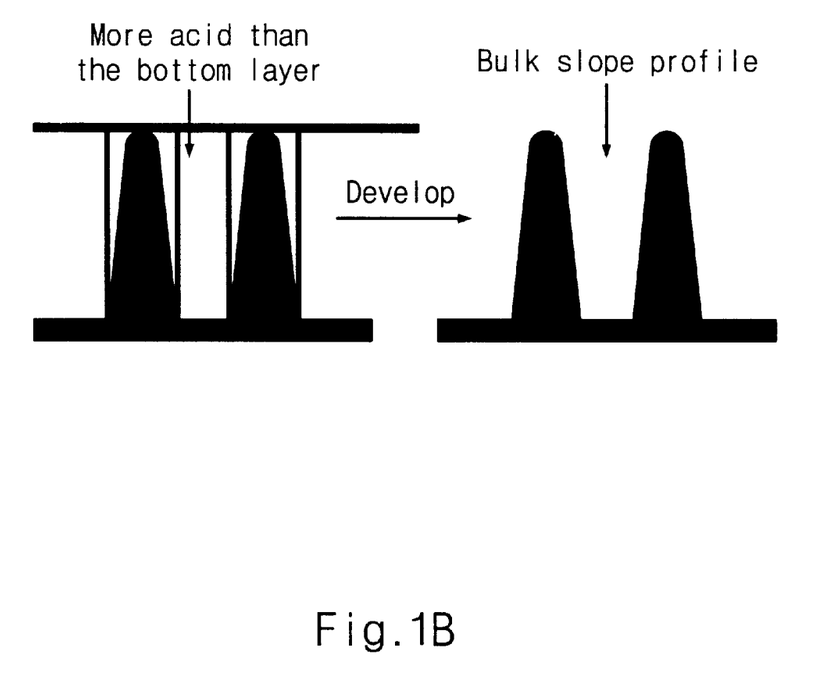
FIG. 1b is a cross sectional view of the sloping pattern formation when the coated photoresist composition has high light absorbance.

In accordance with the present invention, when a pattern is formed by using the photoresist composition of the present invention containing the photo radical generator, the vertical pattern shown in FIG. 1a is formed but not the sloping pattern shown in FIG. 1b.

The present invention will now be described in more detail by referring to the examples below, which are not intended to be limiting.

COMPARATIVE EXAMPLE 1

Preparation of Photoresist Compositions which do not Comprise Photo Radical Generator, and Formation of Patterns To 160 g of PGMEA were added 20 g of the polymer of Formula 2 and 0.24 g of triphenylsulfonium triflate. The resulting mixture was filtered through 0.20 µm filter, to obtain a photoresist composition.

Figure 2:
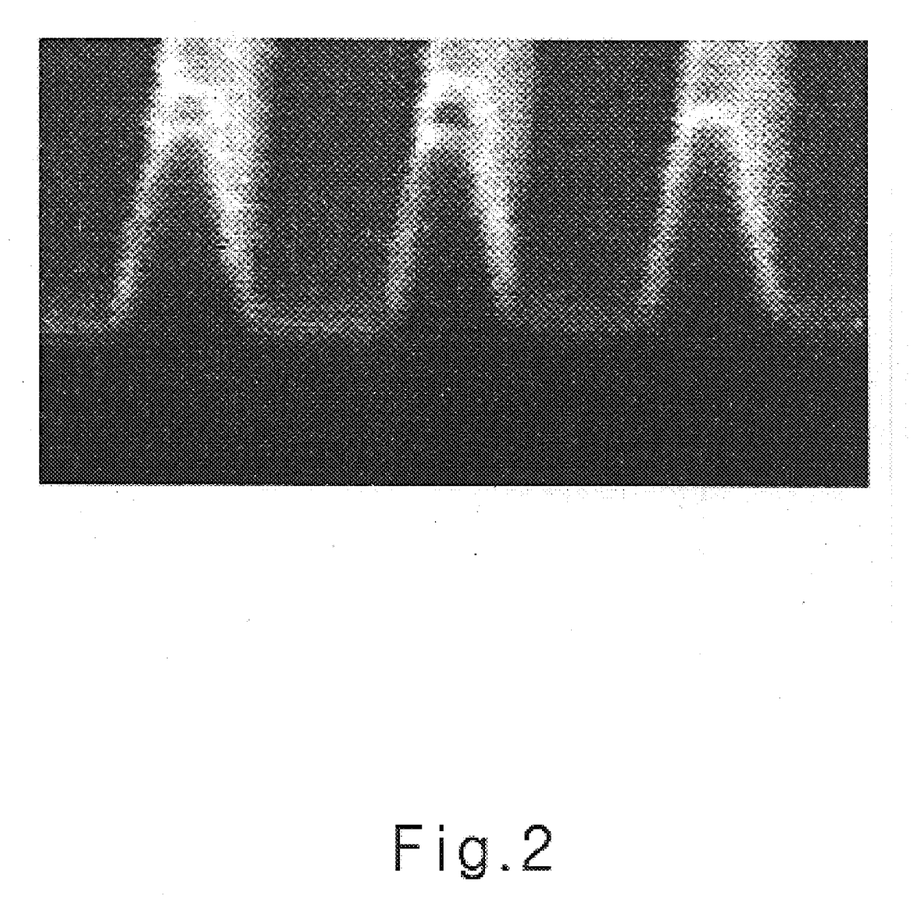
FIG. 2 shows a pattern obtained from Comparative Example 1.

The photoresist composition thus prepared was spin-coated on a silicon wafer, and soft-baked at 140° C. for 90 seconds. After baking, the photoresist was exposed to light using an ArF laser exposer, and then post-baked at 140° C. for 90 seconds. Thereafter, it was developed in 2.38 wt % aqueous TMAH solution to obtain a 0.15 µm L/S sloped pattern (see FIG. 2).

INVENTION EXAMPLE 1

Preparation of Photoresist Compositions Comprising Photo Radical Generator, and Formation of Patterns To 160 g of PGMEA were added 20 g of the polymer of Formula 2, 0.24 g of triphenylsulfonium triflate and 0.12 g of the photo radical generator of Formula 1a. The resulting mixture was filtered through 0.20 µm filter, to obtain a photoresist composition.

The photoresist composition thus prepared was spin-coated on a silicon wafer, and soft-baked at 140° C. for 90 seconds. After baking, the photoresist was exposed to light using an ArF laser exposer, and then post-baked at 140° C. for 90 seconds. Thereafter, it was developed in 2.38 wt % aqueous TMAH solution to obtain a 0.15 µm L/S vertical pattern (see FIG. 3).

INVENTION EXAMPLE 2

Preparation of Photoresist Compositions Comprising Photo Radical Generator, and Formation of Patterns To 160 g of PGMEA were added 20 g of the polymer of Formula 2, 0.24 g of triphenylsulfonium triflate and 0.10 g of the photo radical generator of Formula 1b. The resulting mixture was filtered through 0.20 µm filter, to obtain a photoresist composition.

The photoresist composition thus prepared was spin-coated on a silicon wafer, and soft-baked at 140° C. for 90 seconds. After baking, the photoresist was exposed to light using an ArF laser exposer, and then post-baked at 140° C. for 90 seconds. Thereafter, it was developed in 2.38 wt % aqueous TMAH solution to obtain a 0.15 µm L/S vertical pattern (see FIG. 4).

The photoresist composition comprising the photo radical generator forms the vertical pattern, differently from Comparative Example 1.

Figure 3:
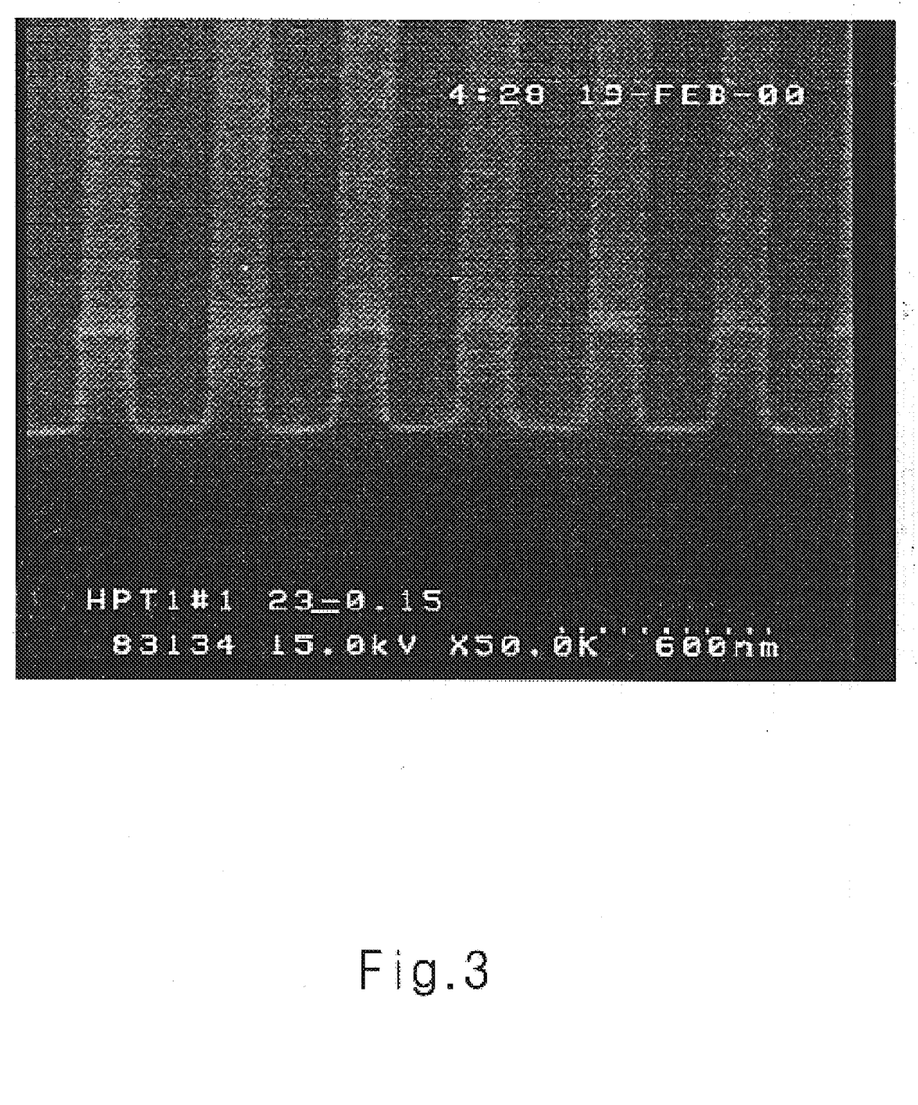
FIG. 3 shows a pattern obtained from Invention Example 1.
Figure 4:
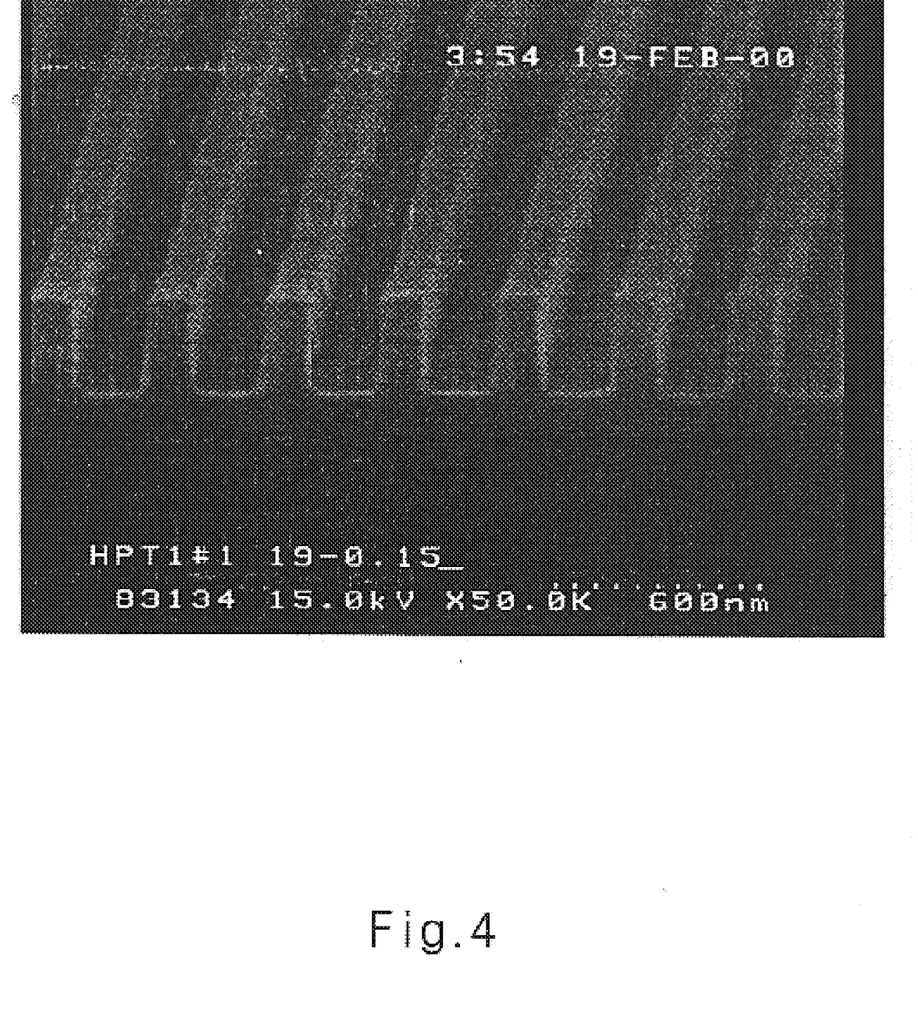
FIG. 4 shows a pattern obtained from Invention Example 2.

As discussed earlier, relative to photoresist compositions having no photo radical generator, the photoresist compositions containing the photo radical generator improve the detrimental sloping pattern (FIG. 2) by producing a substantially perpendicular patterns (FIGS. 3 and 4). Thus, the photoresist compositions of the present invention are useful for obtaining ultrafine patterns, especially for photolithography employing a short wavelength light source, such as ArF (193 nm) and VUV (157 nm).

The foregoing discussion has been presented for purposes of illustration and description. The foregoing is not intended to limit this disclosure to the form or forms disclosed herein. Although the above description has included description of one or more embodiments and certain variations and modifications, other variations and modifications are within the scope of this disclosure, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising:
   (a) a photoresist resin, said photoresist resin comprising a chemically amplified photoresist polymer comprising repeating units prepared by additional polymerization of cycloolefin comonomers, (b) a photoacid generator, (c) a photo radical generator of the following Formula 1 and (d) an organic solvent:

Formula 1 wherein, $R_1$ is hydrogen or $(C_1-C_5)$ alkyl;
$R_2$ is hydrogen, $(C_1-C_5)$ alkyl or phenyl; and
$R_3$ is hydrogen, $(C_1-C_5)$ alkyl, phenyl or $(C_1-C_5)$ alkoxy.

2. The photoresist composition of claim 1 wherein said compound of Formula 1 is selected from the group consisting of α,α-dimethoxy-α-phenylacetophenone and α-hydroxy-α,α-dimethylacetophenone.

3. The photoresist composition of claim 1 wherein said photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

4. The photoresist composition of claim 1 wherein an amount of said photoacid generator ranges from about 0.05% by weight to about 10% by weight of said photoresist resin.

5. The photoresist composition of claim 1 wherein an amount of said photo radical generator ranges from about 10 mole % to about 300 mole % of said photoacid generator.

6. The photoresist composition of claim 1 wherein said photoresist polymer is selected from the group consisting of poly(tert-butyl bicyclo[2.2.1]hept-5-ene-2-carboxylate/2-hydroxyethyl bicyclo[2.2.1]hept-5-ene-2-carboxylate/norbornylene/maleic anhydride) and poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

7. The photoresist composition of claim 1 wherein said organic solvent is selected from the group consisting of methyl 3-methoxypropionate, ethyl 3-ethoxypropionate, propylene glycol methyl ether acetate (PGMEA), cyclohexanone and 2-heptanone.

8. The photoresist composition of claim 1 wherein an amount of said organic solvent ranges from about 200% by weight to about 800% by weight of the photoresist resin.

9. A process for forming a photoresist pattern, comprising:
   (a) coating a photoresist composition of claim 1 on a substrate to form a photoresist film;
   (b) exposing said photoresist film to light; and
   (c) developing said exposed photoresist film.

10. The process of claim 9 further comprising a baking step before and/or after the exposure of step (b).

11. The process of claim 10 wherein said baking step is performed at temperature ranging from about 70° C. to about 200° C.

12. The process of claim 9 wherein the light source of exposure step is selected from the group consisting of ArF having a wavelength of 193 nm, KrF having a wavelength of 248 nm, VUV having a wavelength of 157 nm, EUV having a wavelength of 13 nm, E-beam, X-ray and ion beam.

13. The process of claim 9 wherein an exposure energy of the light ranges from about 1 mJ/cm$^2$ to about 100 mJ/cm$^2$.

* * * * *